United States Patent
Tsuchiya (10) Patent No.: US 7,263,478 B2
(45) Date of Patent: Aug. 28, 2007

(54) SYSTEM AND METHOD FOR DESIGN VERIFICATION

(75) Inventor: Takehiko Tsuchiya, Kanagawa-ken (JP)

(73) Assignee: Kabushiki Kaisha Toshiba (JP)

( * ) Notice: Subject to any disclaimer, the term of this patent is extended or adjusted under 35 U.S.C. 154(b) by 776 days.

(21) Appl. No.: 09/962,827

(22) Filed: Sep. 25, 2001

(65) Prior Publication Data

US 2002/0038203 A1 Mar. 28, 2002

(30) Foreign Application Priority Data

Sep. 25, 2000 (JP) .......................... P2000-290530

(51) Int. Cl.
*G06F 17/50* (2006.01)

(52) U.S. Cl. ............................. 703/14; 703/15; 703/16; 703/17; 716/4; 716/5; 716/16; 716/17; 716/3; 716/18; 716/12; 714/739; 714/741; 714/742

(58) Field of Classification Search .................. 703/13; 714/733; 324/765; 712/19; 706/55; 700/121
See application file for complete search history.

(56) References Cited

U.S. PATENT DOCUMENTS

| | | | | |
|---|---|---|---|---|
| 5,604,895 A | | 2/1997 | Raimi | |
| 5,841,674 A | * | 11/1998 | Johannsen | .................... 716/12 |
| 6,132,109 A | * | 10/2000 | Gregory et al. | ............. 717/131 |
| 6,487,704 B1 | * | 11/2002 | McNamara et al. | ........... 716/5 |
| 6,523,151 B2 | * | 2/2003 | Hekmatpour | .................. 716/4 |
| 6,530,054 B2 | * | 3/2003 | Hollander | .................... 714/739 |
| 6,775,810 B2 | * | 8/2004 | Chang et al. | .................. 716/4 |
| 6,816,825 B1 | * | 11/2004 | Ashar et al. | .................. 703/14 |

* cited by examiner

*Primary Examiner*—Fred Ferris
*Assistant Examiner*—Cuong Van Luu
(74) *Attorney, Agent, or Firm*—Kilpatrick Stockton LLP (57) ABSTRACT

An extractor extracts descriptions unexecuted in the logic simulation according to code coverage information for the circuit description. An examiner examines whether or not there is a possibility of executing the extracted unexecuted descriptions. A prohibited-input-checker generator generates a test pattern. The test pattern is to execute descriptions including unexecuted descriptions that there is a possibility of executing and excluding unexecuted descriptions that there is no possibility of executing as determined by the examiner. The prohibited-input-checker generator also generates a prohibited-input checker to check whether or not an input pattern of a logic simulation to be carried out is equal to an input pattern of the test pattern to execute the unexecuted description if the test bench is regarded as a prohibited input under a specification at a logic simulation using the test pattern to execute the unexecuted description.

18 Claims, 7 Drawing Sheets

SYSTEM AND METHOD FOR DESIGN VERIFICATION

CROSS REFERENCE TO RELATED APPLICATIONS

This application is based upon and claims the benefit of priority under 35 USC 119 from the prior Japanese Patent Application No. P2000-290530, filed on Sep. 25, 2000; the entire contents of which are incorporated herein by reference.

BACKGROUND OF THE INVENTION

1. Field of the Invention

The present invention relates to a system for and a method of verifying an electronic circuit design. In particular, the present invention relates to a technique of efficiently managing code coverage information on an electronic circuit design.

2. Description of the Related Art

Recent large-scale, sophisticated electronic circuits and their developing speeds are promoting the reuse of design resources of previous products. When developing a new circuit having given specifications by reusing design resources, an important thing is to thoroughly verify the reliability of the design resource. Code coverage information is widely used to verify the reliability of design resources. The code coverage information is a record of codes or descriptions contained in a circuit description and tested through logic simulations. Here, the "circuit description" is a form of expressing the connective relationships of a circuit and is composed of a plurality of descriptions such as RTL (register transfer level) descriptions, the "descriptions" being substantially synonymous with "codes." The code coverage information is expressible in a value such as a percentage. The code coverage information of a given resource circuit is useful to understand how many descriptions contained in a circuit description of the resource circuit were tested in logic simulations and grasp the reliability of the resource circuit. There are other information pieces employable to verify the reliability of design resources, such as state coverage information indicating whether or not each line of a circuit description tested in logic simulations and branch coverage information indicating whether or not conditional expressions, such as conditional branch, of a circuit description tested in logic simulations. These pieces of information are useful to improve the reliability of circuit design verification.

There are some related arts that prepare code coverage information and use it for circuit design verification. Problems of the related arts will be explained. A first problem is that the related arts must prepare several kinds of code coverage information for each circuit, thereby increasing the amount of information in proportion to circuit size and complicating the management of gathered information pieces.

A second problem is that the related arts must prepare code coverage information for each test environment and each set of test patterns. When existing circuits are combined to form a new circuit and when an overall verification test is carried out on the new circuit under a new test environment with a new set of test patterns, there is no use, for the overall verification test, of code coverage information gathered through individual tests of the existing circuits. Even if the overall verification test finds a problem, the related arts are incapable of determining whether the problem has been caused by descriptions unverified in the individual tests of the existing circuits, or by an input signal string used for the overall verification test, or by peripheral circuits. The related arts, therefore, provide very low debugging efficiency.

SUMMARY OF THE INVENTION

An aspect of the present invention provides a system for verifying a circuit represented with a circuit description including descriptions. The system includes a simulator to carry out a logic simulation of the circuit description with the use of a test bench, an extractor to extract descriptions unexecuted in the logic simulation according to code coverage information concerning the circuit description, an examiner to examine whether or not there is a possibility of executing the extracted unexecuted descriptions, and a prohibited-input-checker generator to generate a test pattern to execute the unexecuted description, and if the result of a logic simulation carried out with the test pattern to execute the unexecuted description shows a violation of specifications, generate a prohibited-input checker to check whether or not an input pattern of a logic simulation to be carried out afterward is equal to an input pattern of the test pattern to execute the unexecuted description.

Another aspect of the present invention provides a method of verifying a circuit represented with a circuit description including a plurality of descriptions, comprising, carrying out a logic simulation of the description having a possibility of being executed, with the use of a test bench for the circuit description, extracting descriptions unexecuted in the logic simulation according to code coverage information for the circuit description, examining whether or not there is a possibility of executing the extracted unexecuted descriptions, generating an test pattern to execute the unexecuted description that there is a possibility of executing; and if the test bench is regard as a prohibited input under a specification at a logic simulation using the test pattern to execute the unexecuted description, generating a prohibited-input checker to check whether or not an input pattern of a logic simulation to be carried out is equal to an input pattern of the test pattern to execute the unexecuted description.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 1:
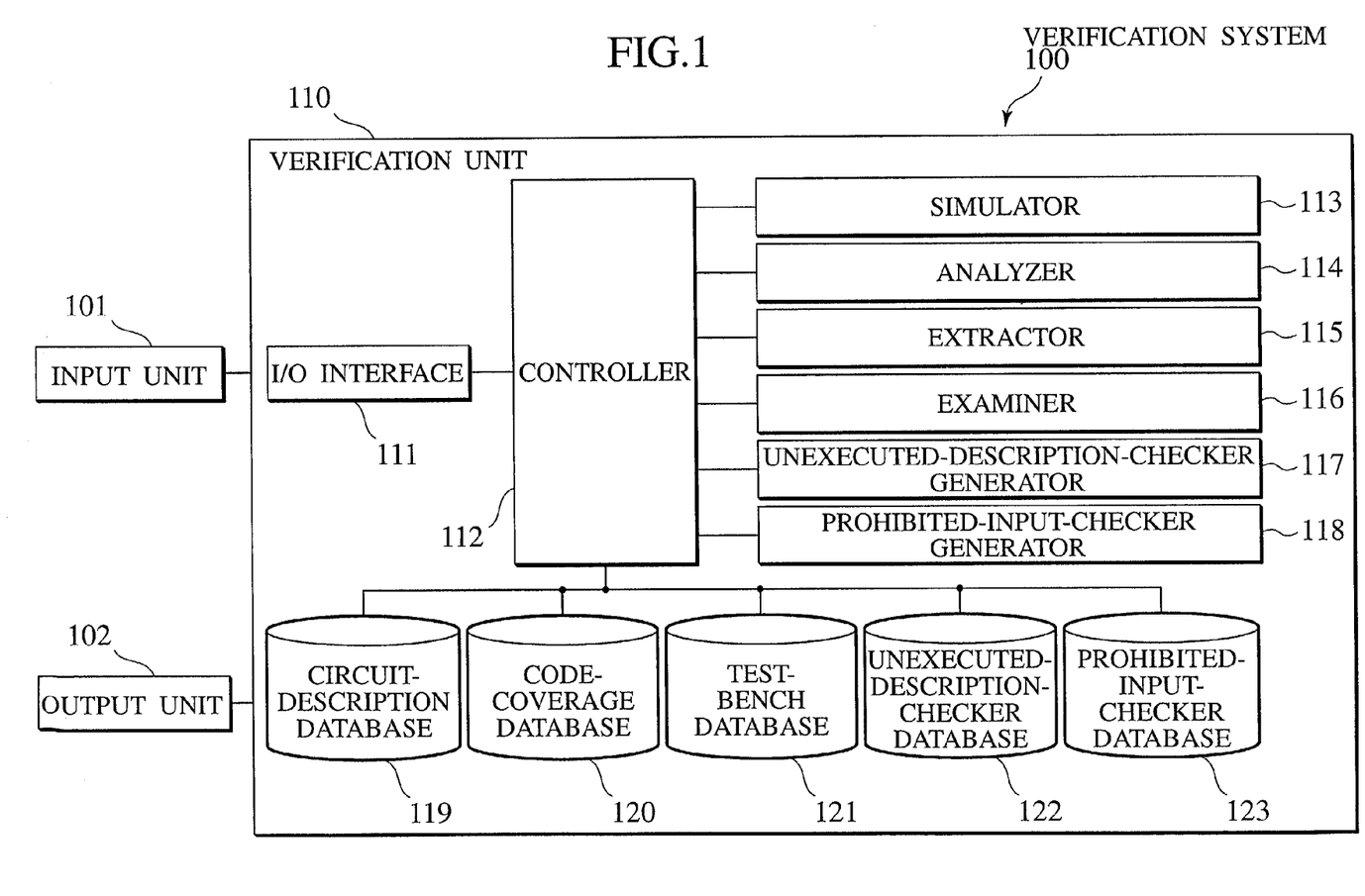
FIG. 1 is a block diagram showing a system for verifying a circuit according to an embodiment of the present invention.

FIG. 1 is a block diagram showing a design verification system according to an embodiment of the present invention. The system 100 has a verification unit 110 to manage code coverage information. The verification unit 110 includes an I/O interface 111, a controller 112, a simulator 113, an analyzer 114, an extractor 115, an examiner 116, an unexecuted-description-checker generator 117, a prohibited-input-checker generator 118, a circuit-description database 119, a code-coverage database 120, a test-bench database 121, an unexecuted-description-checker database 122, and a prohibited-input-checker database 123.

The verification unit 110 is electrically connected to an input unit 101 to receive data concerning the verification unit 110 and control data and an output unit 102 to provide data concerning the verification unit 110 and error information. The input unit 101 may be a keyboard, a mouse pointer, a light pen, etc. The output unit 102 may be a display, a printer, an audio output unit, etc.

The I/O interface 111 supports and controls data communication between a user and the verification unit 110. The I/O interface 111 may be a graphical user interface. The controller 112 controls the operations of various elements in the verification unit 110. The simulator 113 acquires code coverage information and carries out simulations. The analyzer 114 provides the user with an environment to analyze simulation results and code coverage information. For example, the analyzer 114 has a function of displaying signal waveforms at optional locations in a target circuit. The analyzer 114 may have a function of providing the user with information about bugs found in a circuit description and a possibility of additional test inputs, so that the user may fix the bugs. The extractor 115 refers to code coverage information gathered from simulations and extracts descriptions unexecuted in the logic simulations carried out by the simulator 113. The unexecuted descriptions may include RTL (register transfer level) descriptions.

The examiner 116 examines whether or not there is a possibility of executing the unexecuted descriptions extracted in the extractor 115. At this time, the examiner 116 may employ a model checking technique using a formal verification. The model checking technique is a technique to examine whether or not a designed logic circuit satisfies design specifications. The model checking technique is also called a formal verifier, a property check, and an assertion check. This embodiment uses the general term "model checking technique." The model checking technique employs, for example, a diagram theory that logic functions having the same characteristics are deformable to reduced ordered binary decision diagrams of the same shape. Based on the diagram theory, the model checking technique determines whether or not a designed logic circuit satisfies design specifications.

The unexecuted-description-checker generator 117 generates an unexecuted-description checker. Whenever an unexecuted description that there is a possibility of executing is going to be executed in a logic simulation to be carried out afterward, the unexecuted-description checker generator generates unexecuted-description-checker that provides the output unit 102 with a message that an unexecuted description is going to be executed.

The prohibited-input-checker generator 118 reversely traces the circuit description to an unexecuted description, prepares a test pattern to execute the unexecuted description, and if a logic simulation based on the test pattern violates specifications, generates a prohibited-input checker to check whether or not an input pattern of a logic simulation to be carried out afterward is equal to the input pattern of the test pattern.

The circuit-description database 119 stores descriptions such as RTL descriptions expressing the specifications and operations of a circuit to design. The code-coverage database 120 stores code coverage information on the descriptions stored in the circuit-description database 119. The test-bench database 121 stores test benches used to verify the design of the circuit to design. Each test bench includes a test pattern and a simulation model such as a ROM or RAM simulation model. The unexecuted-description-checker database 122 stores unexecuted-description checkers generated by the unexecuted-description-checker generator 117. The prohibited-input-checker database 123 stores prohibited-input checkers generated by the prohibited-input-checker generator 118.

Figure 7:
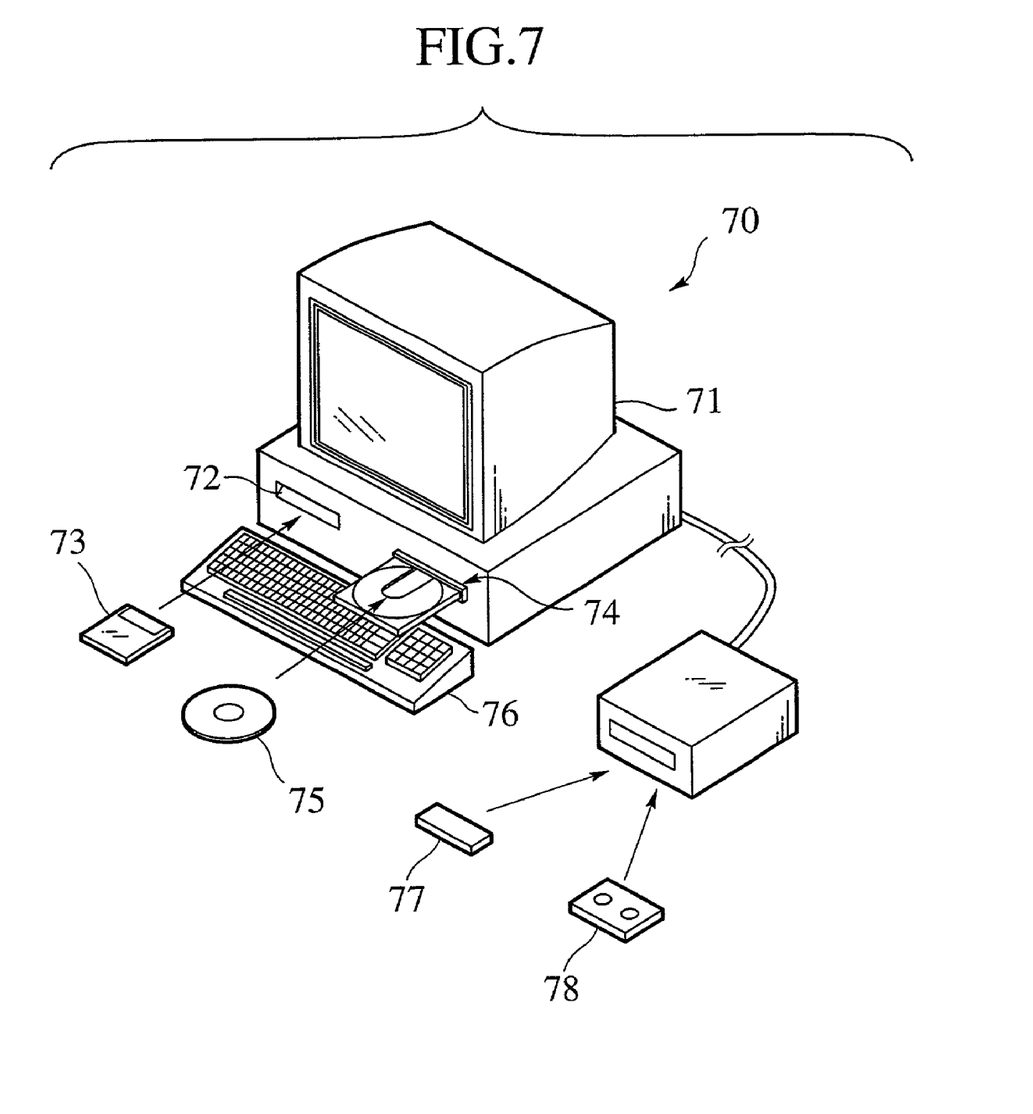
FIG. 7 shows an example of a computer system serving as a system for verifying a circuit according to an embodiment of the present invention.

The design verification system 100 according to the embodiment is realized by, for example, a computer such as a general-purpose computer, a workstation, a personal computer, and a network computer. FIG. 7 shows a computer system 70 serving as the design verification system 100 according to the present invention. The computer system 70 has a floppy disk drive 72 and an optical disk drive 74. The drive 72 receives a floppy disk 73, and the drive 74 receives an optical disk 75. Programs stored in the disks 73 and 75 are read by and installed in the computer system 70. The computer system 70 may be connected to a proper drive to handle a ROM 77 or a magnetic tape cartridge 78, to read and write data and programs to and from the ROM 77 and cartridge 78.

The design verification system 100 realized by the computer system 70 is capable of managing code coverage information, determining whether or not an input pattern of a logic simulation is equal to a prohibited input pattern, and informing the user of every unexecuted description whenever it is going to be executed in a logic simulation. The design verification system 100 efficiently manages code coverage information.

(Design Verification Method)

A design verification method according to an embodiment of the present invention will be explained. The method is executable by the design verification system 100 of FIG. 1.

Figure 2:
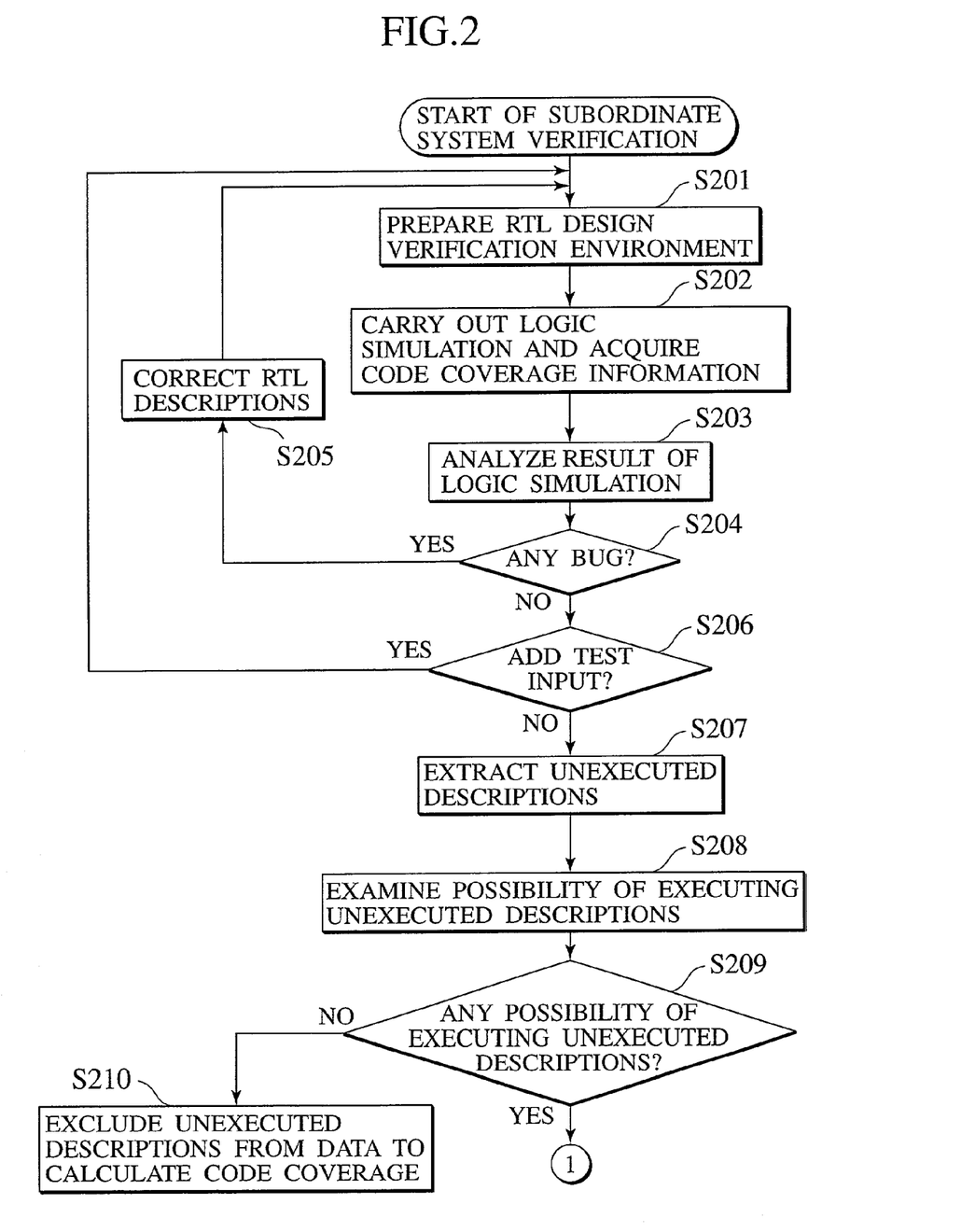
FIG. 2 is a flowchart showing a method of verifying a circuit according to an embodiment of the present invention.
Figure 3:
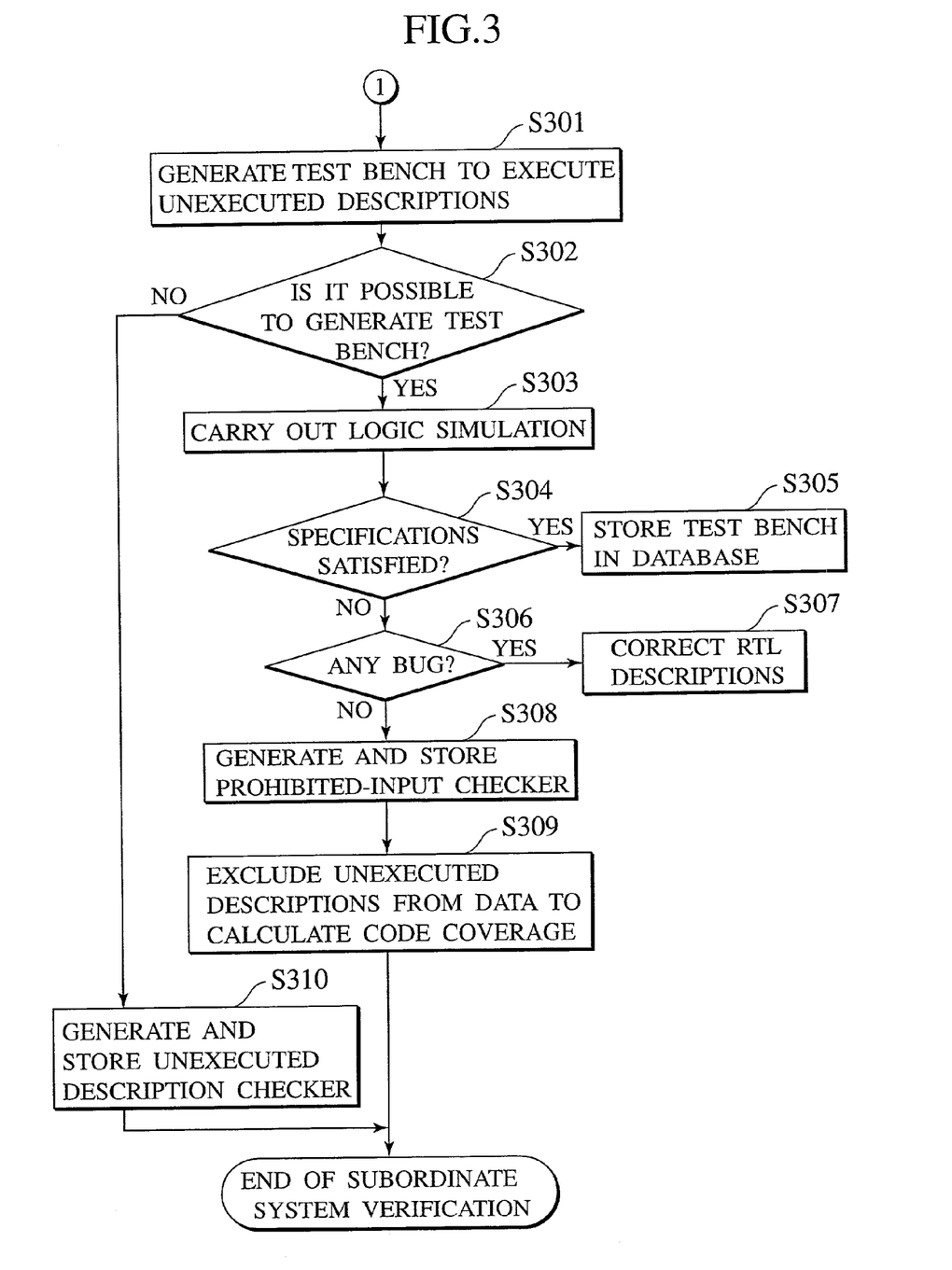
FIG. 3 is a continuation of the flowchart in FIG. 2.

FIGS. 2 and 3 are flowcharts showing the method. In FIGS. 2 and 3, the method verifies the design of a circuit serving as a subordinate system, a plurality of subordinate systems being combined to form a superordinate system or circuit. In step S201, a user prepares an RTL design verification environment. An instruction to start a logic simulation is entered through, for example, the input unit 101. In response to the instruction, steps mentioned below are initiated.

In step S202, the simulator 113 carries out a logic simulation and acquires code coverage information. After the completion of the logic simulation, the user employs, in step S203, the analyzer 114 to analyze a result of the logic simulation and the code coverage information, and tries to improve the reliability of circuit verification. At this time, the user may visually determine whether or not displayed signal waveforms conform to specifications, or may carry out an automatic verification to determine if the circuit to be designed meets specifications and examine unexecuted RTL descriptions.

Step S204 determines whether or not there is any description involving a problem or a "bug." If there is a bug, step S205 fixes the bug. Step S206 determines whether or not a test input can be added. If YES in step S206, the flow returns to step S201 to prepare an RTL design verification environment. Through these steps, the reliability of circuit design verification is improved.

If bugs are fixed to a proper extent and if it is determined that an improvement in the reliability of circuit design verification by adding and correcting test patterns is maximized, the extractor 115 checks code coverage information collected through the logic simulations and extracts, in step S207, unexecuted descriptions.

The extracted unexecuted descriptions include descriptions not executed in the logic simulations and descriptions collected based on the code coverage information, such as branch and state descriptions.

In step S208, the examiner 116 employs a model checking technique to determine whether or not there is a possibility of executing the unexecuted descriptions. Step S209 analyzes a result of step S208 and determines whether or not the unexecuted descriptions are logically executable. If YES in step S209, step S301 is carried out, and if NO, step S210 excludes the unexecuted descriptions from data to calculate code coverage information. The determinations in steps S204, S206, and S209 may be made by the system 100 or by the user by examining data provided by the system 100.

FIG. 3 is a continuation of the flowchart in FIG. 2. In step S301, the prohibited-input-checker generator 118 reversely traces the circuit description to the unexecuted descriptions, finds an input pattern for the unexecuted descriptions, and tries to prepare a test pattern to execute the unexecuted descriptions. Step S302 determines whether or not it is possible to prepare such a test pattern to execute the unexecuted descriptions. The case that it is impossible to prepare the unexecuted description test bench includes that generating condition of the test pattern to execute the unexecuted description is too intricate to generate the test pattern to execute the unexecuted descriptions. If it is impossible to make the test pattern to execute the unexecuted descriptions, step S310 is carried out, and if possible, step S303 is carried out. The test pattern to execute the unexecuted descriptions include not only descriptions regard as those that there is a possibility of logically executing in the examiner 116, but also descriptions that are unable to examine whether or not there is a possibility of executing due to the capacity of the examiner 116.

In step S303, the simulator 113 carries out a logic simulation employing the test pattern to execute the unexecuted descriptions generated by the prohibited-input-checker generator 118. Step S304 analyzes a result of the logic simulation and determines whether or not the result satisfies specifications. If the result satisfies the specifications, step S305 stores the test pattern to execute the unexecuted descriptions into the test-bench database 121. If the result does not satisfy the specifications, step S306 examines whether or not there are bugs in the descriptions. If there are bugs, step S307 corrects the descriptions to fix the bugs. If there are no bugs, step S308 is carried out.

If the result of the logic simulation carried out in step S303 does not satisfy the specifications and if there are no bugs in the descriptions, the input pattern of the test pattern to execute the unexecuted descriptions must be a pattern prohibited by the specifications. In this case, the prohibited-input-checker generator 118 generates, in step S308, a prohibited-input checker, which is a test bench used to check whether or not an input pattern of a logic simulation to be carried out afterward is equal to the prohibited input pattern. The generated prohibited-input checker is stored in the prohibited-input-checker database 123.

In step S309, the controller 112 excludes the unexecuted descriptions for which the test pattern to execute the unexecuted descriptions and prohibited-input checker have been generated, from data to calculate code coverage information.

If the prohibited-input-checker generator 118 is unable to generate the test pattern to execute the unexecuted description due to, for example, the complexity of test bench generating conditions, step S310 generates an unexecuted-description checker and stores it in the unexecuted-description-checker database 122. The unexecuted-description checker 117 is a test bench to provide the output unit 102 with a message that one of the unexecuted descriptions that there is a possibility of executing examined in the examiner 116 is going to be executed in a logic simulation.

As the size and complexity of a circuit increase, it becomes more difficult to define an external input vector that realizes a code coverage of 100% with respect to descriptions or codes contained in a circuit description representing the circuit. The present invention reversely traces specific descriptions in the circuit description and automatically generates an input pattern to execute the specific descriptions.

Figure 4:
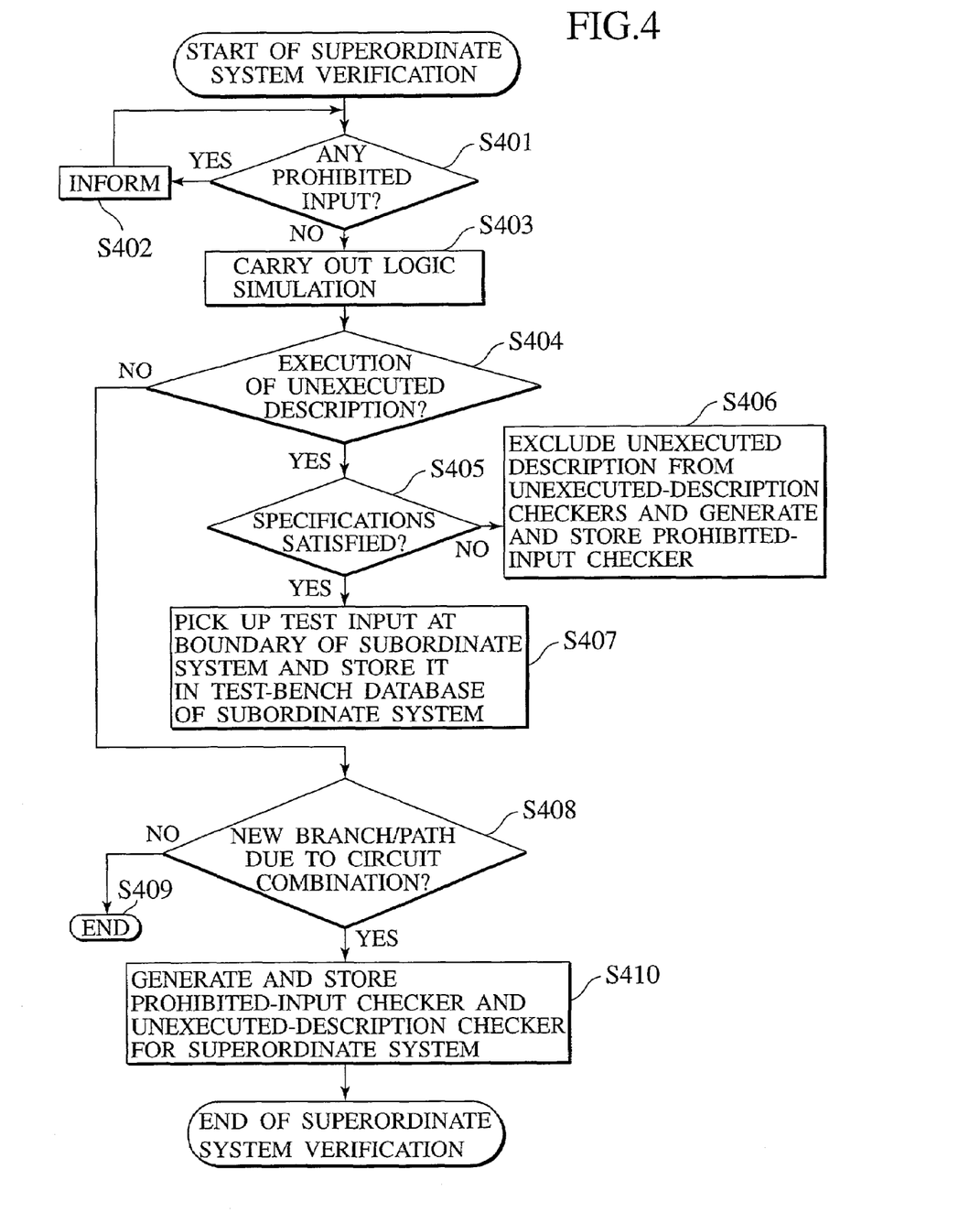
FIG. 4 is a flowchart showing a technique of verifying a superordinate system.

FIG. 4 is a flowchart showing a technique of verifying a superordinate system or circuit. The superordinate system or circuit includes a plurality of subordinate systems or circuits. In step S401, the controller 112 retrieves prohibited-input checkers from the database 123 and checks whether or not a logic simulation of the superordinate system involves any test bench that uses prohibited input patterns related to the subordinate systems.

If YES in step S401, step S402 informs the user of the prohibited input pattern, and the user corrects the test pattern. Then, the flow returns to step S401. If no prohibited input pattern is involved, step S403 is carried out. In step S403, the simulator 113 retrieves test benches from the test-bench database 121 and executes a logic simulation using the retrieved test pattern and a test pattern for the superordinate system. In step S404, the controller 112 retrieves unexecuted-description checkers related to the subordinate systems from the database 122 and determines whether or not unexecuted descriptions that have not been executed in the logic simulation of the subordinate systems are executed in the logic simulation of the superordinate system.

If YES in step S404, step S405 is carried out, and if NO in step S404, step S408 is carried out. In step S405, the controller 112 examines a result of the logic simulation of the superordinate system and determines whether or not a circuit operation at the execution of the unexecuted descriptions satisfies design specifications. This may be made by the user visually inspecting displayed signal waveforms or by automatic verification language assertion. If the unexecuted descriptions do not satisfy the design specifications, step S406 is carried out, and if satisfies, step S407 is carried out.

Step S406 analyzes the result of the simulation and finds the cause of the unsatisfied specifications. If the cause is bugs in the descriptions, step S406 fixes the bugs. If the cause is an input pattern violating the design specifications, the prohibited-input-checker generator 118 generates a prohibited-input checker, which checks whether or not an input pattern of a logic simulation to be carried out afterward is equal to the prohibited input pattern, and stores the prohibited-input checker in the database 123. After the generation of the prohibited-input checker, the controller 112 excludes the unexecuted descriptions that have caused the generation of the prohibited-input checker from data to calculate code coverage information.

If the design specifications are satisfied in step S405, step S407 is carried out. In step S407, the controller 112 picks up an input pattern at the boundary of each subordinate system, stores the input pattern in the test-bench database 121, and stores code coverage information in the code-coverage database 120.

If step S404 determines that the logic simulation of the superordinate system has not executed the unexecuted descriptions forwarded from the subordinate systems, step S408 is carried out. In step S408, the controller 112 determines whether or not new branches or paths are generated by combining the subordinate systems into the superordinate system.

If new branches or paths have been generated, step S410 generates prohibited-input checkers and unexecuted-description checkers for the superordinate system, like those for the subordinate system explained in FIGS. 2 and 3. In combination with the prohibited-input checkers and unexecuted-description checkers for the subordinate systems, the generated checkers are stored as the checkers for the superordinate system in the databases 122 and 123. This completes the superordinate system design verification. If there are no new branches or paths have been generated, no prohibited-input checkers or unexecuted-description checkers for the superordinate system are generated and the superordinate system design verification ends in step S409.

In this way, the design verification method according to the embodiment correctly manages branches to be generated by combining subordinate systems or circuits into a superordinate system or circuit and paths only belonging to superordinate system.

Although the design verification method of the embodiment handles a 2-layer structure made of subordinate systems and a superordinate system, this does not limit the present invention. By repeating the steps mentioned above, the present invention is applicable to verify a superordinate system formed by combining several superordinate systems, or a system formed by collecting several systems together.

Figure 5A:
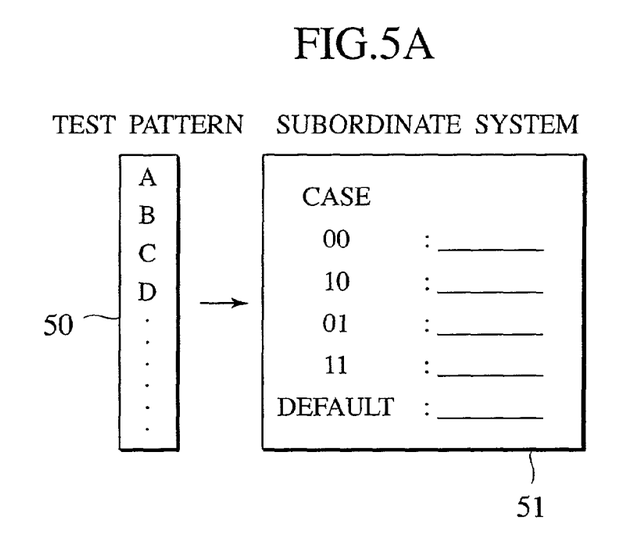
FIG. 5A is a model showing a subordinate system verified according to a related art.
Figure 5B:
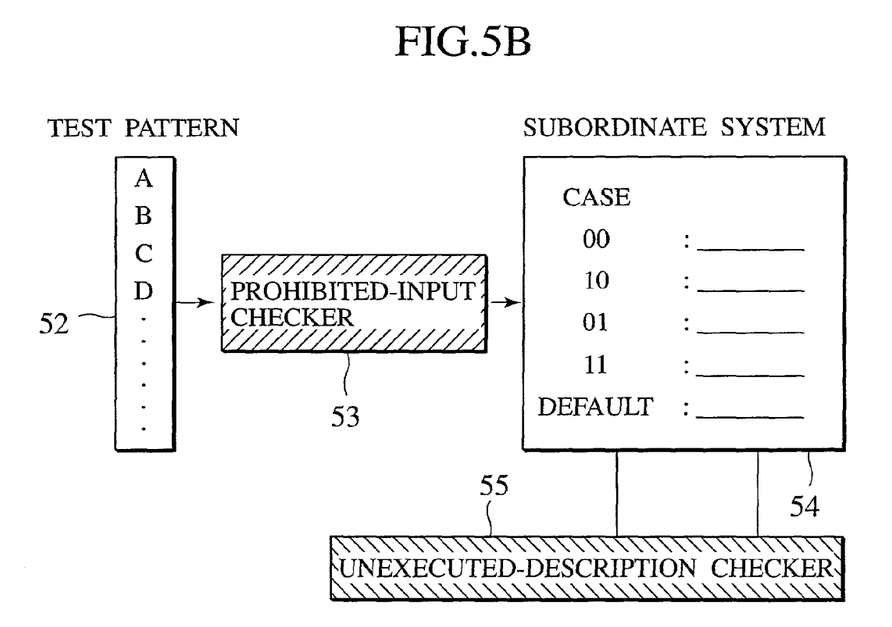
FIG. 5B is a model showing a subordinate system verified according to the present invention.

FIG. 5A is a model showing a subordinate system verified according to a related art, and FIG. 5B is a model showing a subordinate system verified according to the embodiment. The related art in FIG. 5A, the subordinate system receives test patterns 50 to verify the design of the subordinate system. In FIG. 5B, the embodiment according to present invention enters test patterns 52 into a prohibited-input checker 53 at first. The prohibited-input checker 53 monitors the test patterns 52, and if finds vectors that meet prohibited input conditions of the subordinate system, informs the user of the finding. According to this embodiment, an unexecuted-description checker 55 monitors the executing of the subordinate system, and if detects an unexecuted description, the unexecuted description checker 55 informs the user that the unexecuted description is going to be executed.

Figure 6:
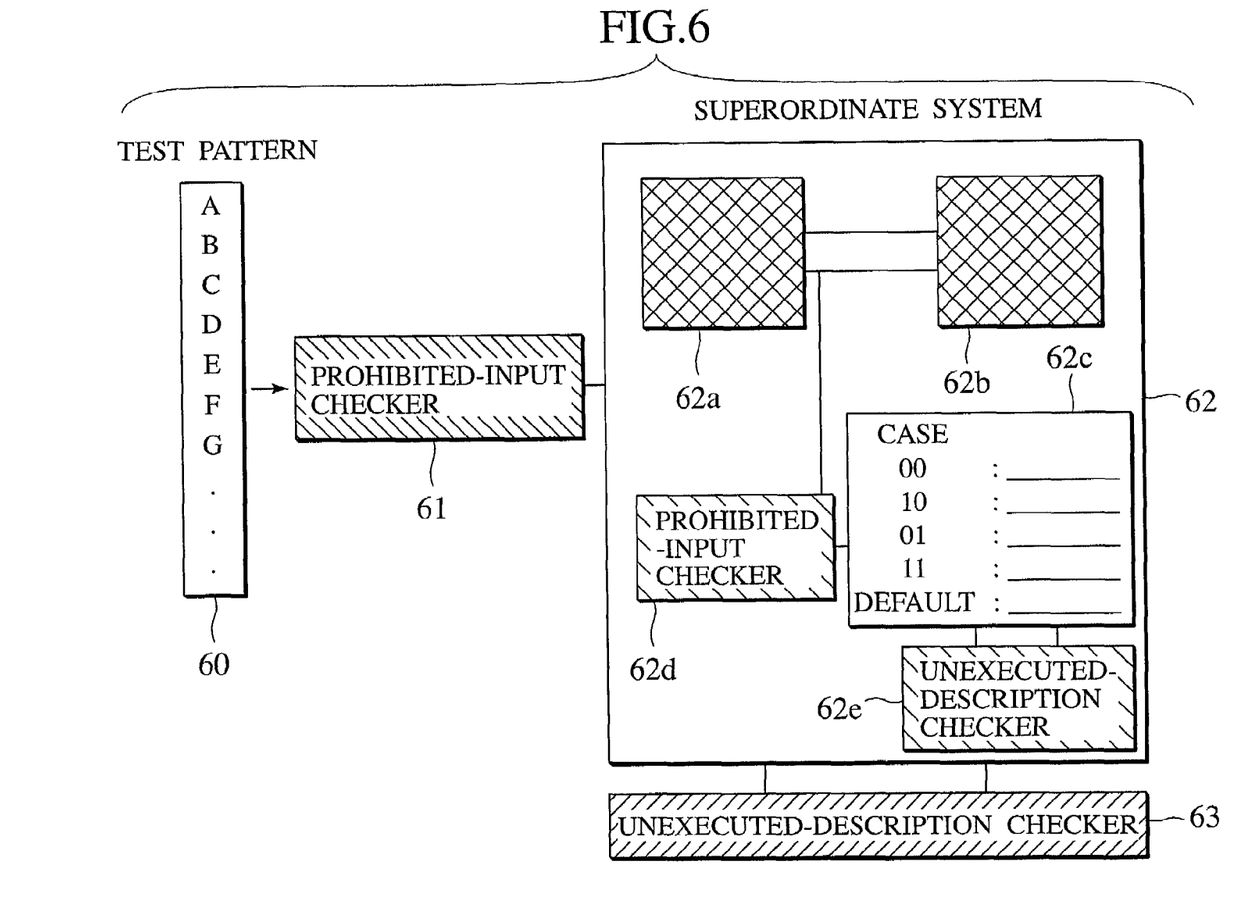
FIG. 6 is a model showing a superordinate system verified according to the present invention.

FIG. 6 is a model showing a superordinate system verified according to the present invention. The superordinate system 62 includes subordinate systems 62a, 62b, and 62c. The subordinate system 62c has a prohibited-input checker 62d and an unexecuted-description checker 62e both generated according to the present invention. A prohibited-input checker 61 of the superordinate system is simply made by combining the prohibited-input checker 62d of the subordinate system and a prohibited-input checker specific to the superordinate system. Even if the circuit structure of the superordinate system is changed or even if the superordinate system is combined with another one, it is easy to manage code coverage information.

As explained above, the design verification system and method of the embodiment according to the present invention are capable of determining whether or not there is a possibility of executing descriptions unexecuted in a logic simulation, to correctly calculate code coverage information.

The embodiment according to the present invention is capable of correctly grasping unexecuted descriptions in a logic simulation irrespective of test environments and automatically verifying and managing the unexecuted descriptions.

The design verification system and method of this embodiment according to the present invention are also capable of testing whether or not circuit descriptions violate specifications irrespective of test environments and managing the reliability of circuit design verification irrespective of test environments. The embodiment according to present invention is capable of testing circuit descriptions under different test environments. Improving the reliability of circuit design verification decreases the amount of information to store, and therefore, makes the management of code coverage information easier.

The design verification method according to the present invention may be realized as a computer program to be stored in a computer readable storage medium. When executing circuit design verification, the storage medium is read by a computer system so that the program is stored in a memory of the computer system. The program is executed by a processor of the computer system, to execute the design verification method of the present invention. The storage medium may be a semiconductor memory, a magnetic disk, an optical disk, a magneto optic disk, a magnetic tape, etc.

Various modifications will become possible for those skilled in the art after receiving the teachings of the present disclosure without departing from the scope thereof.

What is claimed is:

1. A system for verifying a circuit represented with a circuit description including a plurality of descriptions, the system comprising:
   a simulator configured to carry out a logic simulation of the circuit description with the use of a test bench for the circuit description;
   an extractor configured to extract descriptions unexecuted in the logic simulation according to code coverage information for the circuit description;
   an examiner configured to examine whether or not there is a possibility of executing the extracted unexecuted descriptions; and
   a prohibited-input-checker generator configured to generate a test pattern to execute descriptions including unexecuted descriptions that there is a possibility of executing and excluding unexecuted descriptions that there is no possibility of executing,
   wherein the simulator carries out a second logic simulation using the test pattern generated by the prohibited-input-checker generator,
   wherein the prohibited-input-checker generator determines that the test pattern is prohibited by specifications of the circuit if a result of the second logic simulation using the test pattern does not satisfy the specifications and if there are no bugs in the circuit description, and generates a prohibited-input checker that checks whether or not an input pattern of a subsequent logic simulation is equal to the test pattern determined to be prohibited by the specifications;

wherein the simulator informs a user if the input pattern of the subsequent logic simulation and the test pattern are the same.

2. The system as claimed in claim 1, wherein:

the examiner employs a model checking technique when examining whether or not there is a possibility of executing the extracted unexecuted descriptions.

3. A system for verifying a circuit represented with a circuit description including a plurality of descriptions, the system comprising:

a simulator configured to carry out a logic simulation of the circuit description with the use of a test bench for the circuit description;

an extractor configured to extract descriptions unexecuted in the logic simulation according to code coverage information for the circuit description;

an examiner configured to examine whether or not there is a possibility of executing the extracted u n executed descriptions;

a prohibited-input-checker generator configured to generate a test pattern to execute descriptions including unexecuted descriptions that there is a possibility of executing and excluding unexecuted descriptions that there is no possibility of executing; and an unexecuted-description-Checker generator configured to generate an unexecuted-description checker to inform that one of the descriptions from which the system is unable to generate a test bench is going to be executed in a logic simulation, wherein the simulator carries out a second logic simulation using the test pattern generated by the prohibited-input-checker generator, wherein the prohibited-input-checker generator determines that the test pattern is prohibited by specifications of the circuit if a result of the second logic simulation using the test pattern does not satisfy the specifications and if there are no bugs in the circuit description, and generates a prohibited-input checker that checks whether or not an input pattern of a subsequent logic simulation is equal to the test pattern determined to be prohibited by the specifications;

wherein the simulator informs a user if the input pattern of the subsequent logic simulation and the test pattern are the same.

4. The system as claimed in claim 3, wherein:

the examiner employs a model checking technique when examining whether or not there is a possibility of executing the extracted unexecuted descriptions.

5. A method of verifying a circuit represented with a circuit description including a plurality of descriptions, the system comprising:

carrying out a logic simulation of the description having a possibility of being executed, with the use of a test bench for the circuit description;

extracting descriptions unexecuted in the logic simulation according to code coverage information for the circuit description;

examining whether or not there is a possibility of executing the extracted unexecuted descriptions;

generating a test pattern to execute descriptions including unexecuted descriptions that there is a possibility of executing and excluding unexecuted descriptions that there is no possibility of executing; and carrying out a second logic simulation using the test pattern;

determining that the test pattern is prohibited by specifications of the circuit if a result of the second logic simulation using the test pattern does not satisfy the specifications and if there are no bugs in the circuit description;

generating a prohibited-input checker that checks whether or not an input pattern of a subsequent logic simulation is equal to the test pattern determined to be prohibited by the specifications; and informing a user if the input pattern of the subsequent logic simulation and the test pattern are the same.

6. The method as claimed in claim 5, wherein: examining whether or not there is a possibility of executing the extracted unexecuted descriptions employs a model checking technique.

7. A method of verifying a circuit represented with a circuit description including descriptions, the method comprising:

carrying out a logic simulation of the circuit description with the use of a test bench for the circuit description;

extracting descriptions unexecuted in the logic simulation according to code coverage information for the circuit description;

examining whether or not there is a possibility of executing the extracted unexecuted descriptions;

generating a test pattern to execute descriptions including unexecuted descriptions that there is a possibility of executing and excluding unexecuted descriptions that there is no possibility of executing; and carrying out a second logic simulation using the test pattern;

determining that the test pattern is prohibited by specifications of the circuit if a result of the second logic simulation using the test pattern does not satisfy the specifications and if there are no bugs in the circuit description;

generating a prohibited-input checker that checks whether or not an input pattern of a subsequent logic simulation is equal to the test pattern determined to be prohibited by the specifications;

generating an unexecuted-description checker to inform that one of the descriptions from which the system is unable to generate a test bench is going to be executed in a logic simulation; and informing a user if the input pattern of the subsequent logic simulation and the test pattern are the same.

8. The method as claimed in claim 7, wherein examining whether or not there is a possibility of executing the extracted unexecuted descriptions employs a model checking technique.

9. A method of verifying a superordinate system containing at least two subordinate systems, the method comprising:

determining whether or not a test bench to carry out a logic simulation of the superordinate system includes a prohibited input pattern of at least one of the subordinate systems;

if it is determined that the superordinate system includes no prohibited input pattern of the subordinate systems, executing a logic simulation with the use of the test bench;

determining whether or not descriptions unexecuted in logic simulations of the subordinate systems have been executed in the logic simulation of the superordinate system;

if it is determined That the unexecuted descriptions have been executed in the logic simulation of the superordinate system, determining whether or not a result of the logic simulation of the superordinate system related to the unexecuted descriptions satisfies specifications;

if it is determined that the result shows a violation of the specifications and if the cause of the violation is a prohibited input pattern, generating a prohibited-input checker to check whether or not an input pattern of a logic simulation to be carried out is equal to the prohibited input pattern; and eliminating the unexecuted descriptions from an unexecuted-description checker database used to store unexecuted descriptions.

10. The method as claimed in claim 9, further comprising:

if it is determined that the result satisfies the specifications, then picking up an Input pattern at the boundary of each subordinate system; and adding the picked-up input pattern to a database to store test benches for the subordinate systems.

11. The method as claimed in claim 9, further comprising:

if it is determined that the unexecuted descriptions have not been executed in the logic simulation of the superordinate system, determining whether or not new branches and paths are generated by combining the subordinate systems into the superordinate system; and if it is determined that new branches or paths are generated by combining the subordinate systems, generating input checkers and unexecuted-description checkers for the superordinate system.

12. A computer program product including computer readable medium having computable readable code embodied therein executing a method for verifying a circuit represented with a circuit description including a plurality of descriptions, the method comprising:

carrying out a logic simulation of the description having a possibility of being executed, with the use of a test bench for the circuit description;

extracting descriptions unexecuted in the logic simulation according to code coverage information for the circuit description;

examining whether or not there is a possibility of executing the extracted unexecuted descriptions;

generating a test pattern to execute descriptions including unexecuted descriptions that there is a possibility of executing and excluding unexecuted descriptions that there is no possibility of executing; and carrying out a second logic simulation using the test pattern;

determining that the test pattern is prohibited by specifications of the circuit if a result of the second logic simulation using the test pattern does not satisfy the specifications and if there are no bugs in the circuit description; and generating a prohibited-input checker that checks whether or not an input pattern of a subsequent logic simulation is equal to the test pattern determined to be prohibited by the specifications; and informing a user if the input pattern of the subsequent logic simulation and the test pattern are the same.

13. The product as claimed in claim 12, wherein:

examining whether or not there is a possibility of executing the extracted unexecuted descriptions employs a model checking technique.

14. A computer program product including computer readable medium having computable readable code embodied therein executing a method for verifying a circuit represented with a circuit description including descriptions, the method comprising:

carrying out a logic simulation of the circuit description with the use of a test bench for the circuit description;

extracting descriptions unexecuted in the logic simulation according to code coverage information for the circuit description;

examining whether or not there is a possibility of executing the extracted unexecuted descriptions;

generating a test pattern to execute descriptions including unexecuted descriptions that there is a possibility of executing and excluding unexecuted descriptions that there is no possibility of executing;

carrying out a second logic simulation using the test pattern;

determining that the test pattern is prohibited by specifications of the circuit if a result of the second logic simulation using the test pattern does not satisfy the specifications and if there are no bugs in the circuit description;

generating a prohibited-input checker that checks whether or not an input pattern of a logic simulation is equal to the test pattern determined to be prohibited by the specifications;

generating an unexecuted-description checker to inform that one of the descriptions from which the system is unable to generate a test bench is going to be executed in a logic simulation; and informing a user if the input pattern of the subsequent logic simulation and the test pattern are the same.

15. The product as claimed in claim 14, wherein examining whether or not there is a possibility of executing the extracted unexecuted descriptions employs a model checking technique.

16. A computer program product Including computer readable medium having computable readable code embodied therein executing a method for verifying a superordinate system containing at least two subordinate systems, the method comprising:

determining whether or not a test bench to carry out a logic simulation of the superordinate system includes a prohibited input pattern of at least one of the subordinate systems;

if it is determined that the superordinate system includes no prohibited input pattern of the subordinate systems, executing a logic simulation with the use of the test bench;

determining whether or not descriptions unexecuted in logic simulations of the subordinate systems have been executed in the logic simulation of the superordinate system;

if it is determined that the unexecuted descriptions have been executed in the logic simulation of the superordinate system, determining whether or not a result of the logic simulation of the superordinate system related to the unexecuted descriptions satisfies specifications;

if it is determined that the result shows a violation of the specifications and if the cause of the violation is a prohibited Input pattern, generating a prohibited-input checker to check whether or not an input pattern of a logic simulation to be carried out is equal to the prohibited input pattern; and eliminating the unexecuted descriptions from an unexecuted-description checker database used to store unexecuted descriptions.

17. The product as claimed in claim 16, further comprising:

if it is determined that the result satisfies the specifications, then;

picking up an input pattern at the boundary of each subordinate system; and adding the picked-up input pattern to a database to store test benches for the subordinate systems.

18. The product as claimed in claim 16, further comprising:

if it is determined that the unexecuted descriptions have not been executed in the logic simulation of the superordinate system, determining whether or not new branches and paths are generated by combining the subordinate systems into the superordinate system; and if it is determined that new branches or paths are generated by combining the subordinate systems, generating input checkers and unexecuted-description checkers for the superordinate system.

* * * * *